United States Patent
Mimuro et al.

(10) Patent No.: US 9,704,771 B2
(45) Date of Patent: Jul. 11, 2017

(54) FLIP-CHIP MOUNTED SEMICONDUCTOR DEVICE

(71) Applicant: SEIKO INSTRUMENTS INC., Chiba-shi, Chiba (JP)

(72) Inventors: Yoichi Mimuro, Chiba (JP); Kotaro Watanabe, Chiba (JP); Yukimasa Minami, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/927,040

(22) Filed: Oct. 29, 2015

(65) Prior Publication Data

US 2016/0126155 A1    May 5, 2016

(30) Foreign Application Priority Data

Nov. 4, 2014   (JP) ................. 2014-224329

(51) Int. Cl.
| | |
|---|---|
| H01L 23/48 | (2006.01) |
| H01L 21/336 | (2006.01) |
| H01L 23/31 | (2006.01) |
| H01L 21/56 | (2006.01) |
| H01L 29/06 | (2006.01) |
| H01L 23/00 | (2006.01) |

(52) U.S. Cl.
CPC ........ *H01L 23/3178* (2013.01); *H01L 21/563* (2013.01); *H01L 29/0657* (2013.01); *H01L 23/562* (2013.01); *H01L 2224/16225* (2013.01); *H01L 2224/32225* (2013.01); *H01L 2224/73204* (2013.01); *H01L 2224/92125* (2013.01)

(58) Field of Classification Search
CPC ..................................................... H01L 21/563
See application file for complete search history.

(56) References Cited

U.S. PATENT DOCUMENTS

| | | | | |
|---|---|---|---|---|
| 2007/0007639 A1* | 1/2007 | Fukazawa | ............. | H01L 23/481 257/686 |
| 2008/0277765 A1* | 11/2008 | Lane | ...................... | H01L 21/563 257/622 |
| 2010/0265683 A1* | 10/2010 | Iwase | ..................... | H05K 1/181 361/783 |
| 2011/0207266 A1* | 8/2011 | Lee | ....................... | H01L 21/486 438/126 |

OTHER PUBLICATIONS

Abstract, Publication No. 2002-170848, Publication Date Jun. 14, 2002.

* cited by examiner

*Primary Examiner* — Julio J Maldonado
*Assistant Examiner* — Moin Rahman
(74) *Attorney, Agent, or Firm* — Adams & Wilks

(57) ABSTRACT

Provided is a flip-chip mounted semiconductor device in which a crack is less likely to develop. Flip chip mounting is carried out under the condition that no oxide film exists on the scribe region so as to eliminate the interface between the oxide film that remains on the scribe region and the silicon substrate from which a crack may develop. As a result, the circuit board, the encapsulant, and the silicon substrate are stacked at an end portion of the semiconductor chip.

3 Claims, 5 Drawing Sheets

FLIP-CHIP MOUNTED SEMICONDUCTOR DEVICE

BACKGROUND OF THE INVENTION

1. Field of the Invention

The present invention relates to a semiconductor device in which a semiconductor chip is flip-chip mounted on a circuit board.

2. Description of the Related Art

In manufacturing a semiconductor device, there is employed a flip chip mounting technology in which a semiconductor chip is mounted on a circuit board via a bump with an element surface thereof confronting the circuit board. In the flip chip mounting, connection between the circuit board and the semiconductor chip is made by forming a solder bump or the like on the semiconductor chip side, and then pressing the solder bump or the like against wiring formed on the circuit board. An encapsulant such as an epoxy resin is filled between the circuit board and the semiconductor chip for the purpose of securing moisture resistance or alleviating stress on the solder bump from the circuit board.

The encapsulant described above has a thermal expansion coefficient that is higher than that of the semiconductor chip, and thus, during an environmental test such as a temperature cycling test, large thermal stress is applied on the semiconductor chip. The semiconductor chip and the circuit board also have different thermal expansion coefficients, and thus, large stress is applied to the encapsulant as well. As a result, in the temperature cycling test, due to such stress, the solder bump connection will become unstable and a crack will develop in the semiconductor chip.

It is described in Japanese Patent Application Laid-open No. 2002-170848 that, in order to avoid such problems, a bump only for joining is formed in a center region of each side of the semiconductor chip where no bump has heretofore been formed and is connected to the circuit board, to thereby improve reliability.

Further, in the filling step of the encapsulant, when an amount and an injection direction of the encapsulant are efficient, the encapsulant does not cover a side surface of the chip in the formed structure, which is illustrated in FIG. 2. A semiconductor chip 10 is faced down and connected to a circuit board 7 via a bump (not shown). An encapsulant 6 is filled between the semiconductor chip 10 and the circuit board 7. Such a structure is also disclosed in Japanese Patent Application Laid-open No. 2002-170848.

When an encapsulant has such a shape, an end portion of the encapsulant is in contact with a scribe region defined by the double-headed arrow in an outer peripheral portion of the semiconductor chip 10. Stress concentrates in a vicinity of the end portion of the encapsulant, and large thermal stress is applied to the scribe region of the semiconductor chip 10. A crack may then develop from an interface between an oxide film (interlayer insulating film) 3 that remains on the scribe region of the semiconductor chip 10 and a silicon substrate 1 to reach an inside of the semiconductor chip 10. Once a crack develops, the crack breaks a junction portion formed in the semiconductor chip 10, and thus, leakage current is produced, which may increase current consumption or may result in a circuit malfunction.

SUMMARY OF THE INVENTION

Accordingly, an object of the present invention is to provide a semiconductor device using a semiconductor chip suitable for flip chip mounting having a scribe region structure, which can bear a temperature cycling test to a sufficient extent.

In order to solve the problem described above, according to one embodiment of the present invention, there is provided a structure in which no oxide film exists on a scribe region so as to eliminate an interface between an oxide film that remains on a scribe region and a silicon substrate from which a crack may develop, and flip chip mounting is carried out while maintaining this structure. As a result, a circuit board, an encapsulant, and the silicon substrate are stacked in an outer peripheral portion of a semiconductor chip, and thus, large stress is prevented from being applied between an oxide film serving as an interlayer film and the silicon substrate.

According to the one embodiment of the present invention, even in an environment state in which thermal stress is applied, no crack develops in the flip-chip mounted semiconductor chip. Therefore, reliability is improved and effects of stabled characteristics and prevention of deterioration over time may be obtained.

DETAILED DESCRIPTION OF THE EMBODIMENTS

Figure 1:
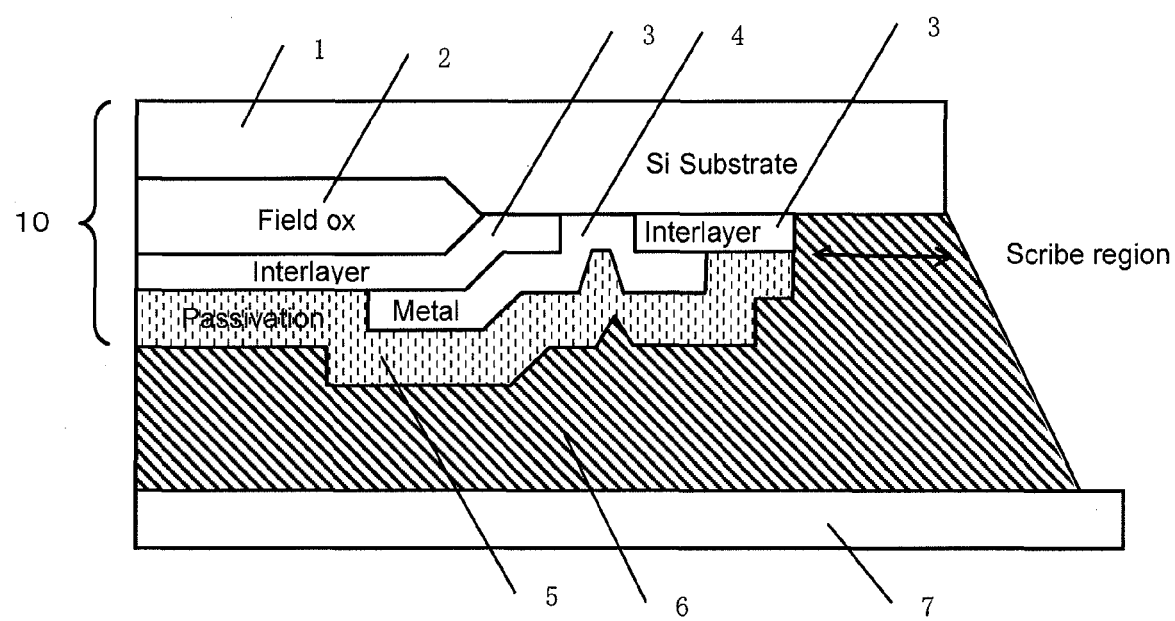
FIG. 1 is a sectional view for illustrating a semiconductor device according to an embodiment of the present invention in which a semiconductor chip is flip-chip mounted on a circuit board.
Figure 2:
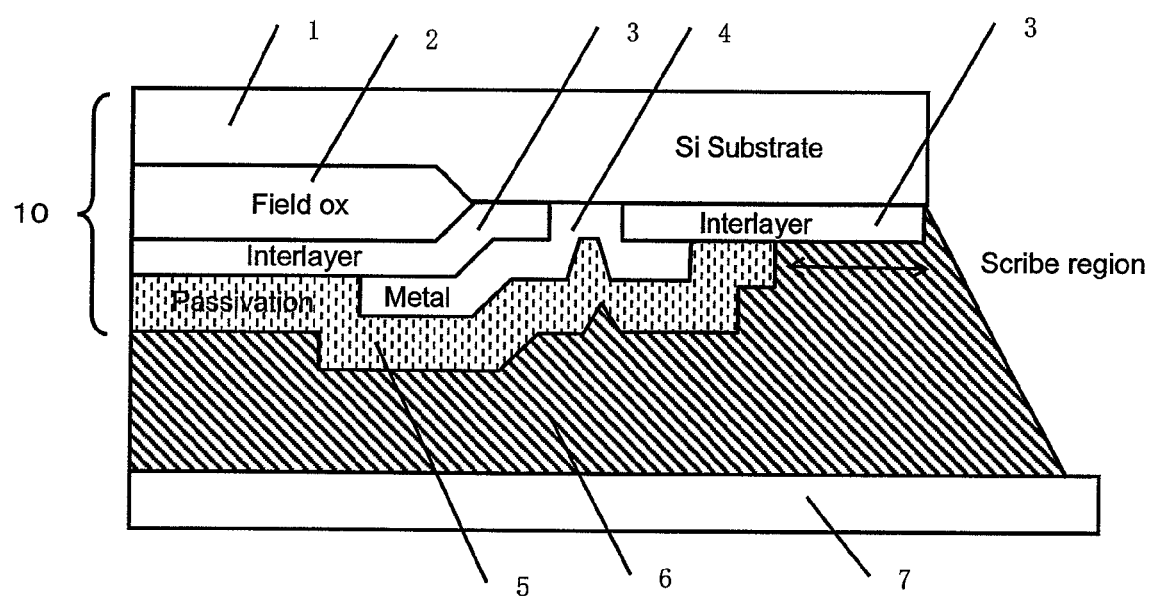
FIG. 2 is a sectional view for illustrating a related-art semiconductor device in which a semiconductor chip is flip-chip mounted on a circuit board.

FIG. 1 is a sectional view for illustrating a semiconductor device according to an embodiment of the present invention in which a semiconductor chip is flip-chip mounted on a circuit board. In the semiconductor device in which the semiconductor chip is flip-chip mounted on the circuit board with an element surface thereof confronting the circuit board, a semiconductor chip 10 is faced down and connected to a circuit board 7 via a bump (not shown). An encapsulant 6 is filled between the semiconductor chip 10 and the circuit board 7. In this case, an end portion of the encapsulant 6 is in contact with a scribe region defined by the double-headed arrow in an outer peripheral portion of the semiconductor chip 10. As shown in FIG. 1, the scribe region extends throughout the outer peripheral portion of the semiconductor chip 10 to a perimeter of the silicon substrate 1. The semiconductor chip 10 includes a field oxide film 2 formed on a surface of a silicon substrate 1, an interlayer insulating film 3 formed so as to extend from the field oxide film 2 to the surface of the silicon substrate 1, a metal wiring layer 4 formed on the interlayer insulating film 3, and a protective film 5 formed on the metal wiring layer 4.

An important point in FIG. 1 is absence of the interlayer insulating film 3 on the scribe region. In this embodiment, together with an end surface of the protective film 5, an end surface of the interlayer insulating film 3 is exposed only at an interface with the scribe region.

Figure 3A:
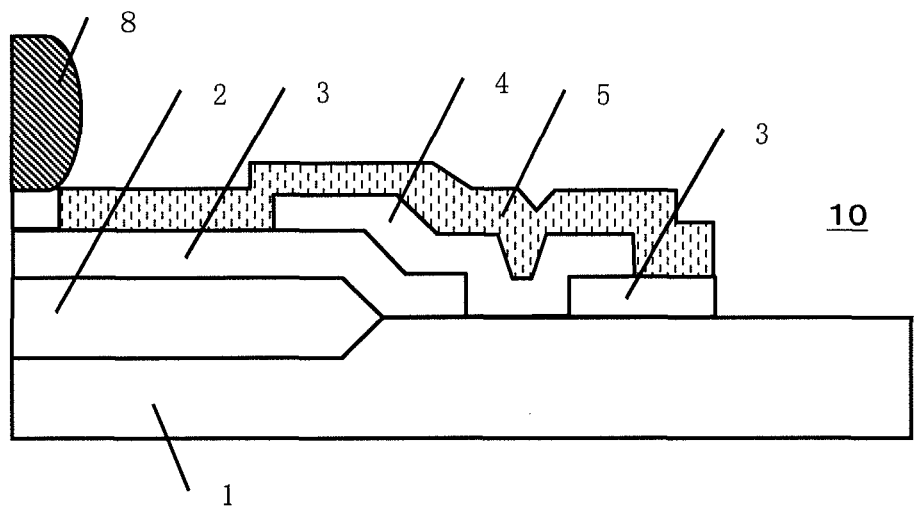
FIGS. 3A-3C are sectional views for illustrating manufacturing steps of the semiconductor device according to the embodiment of the present invention.
Figure 3B:
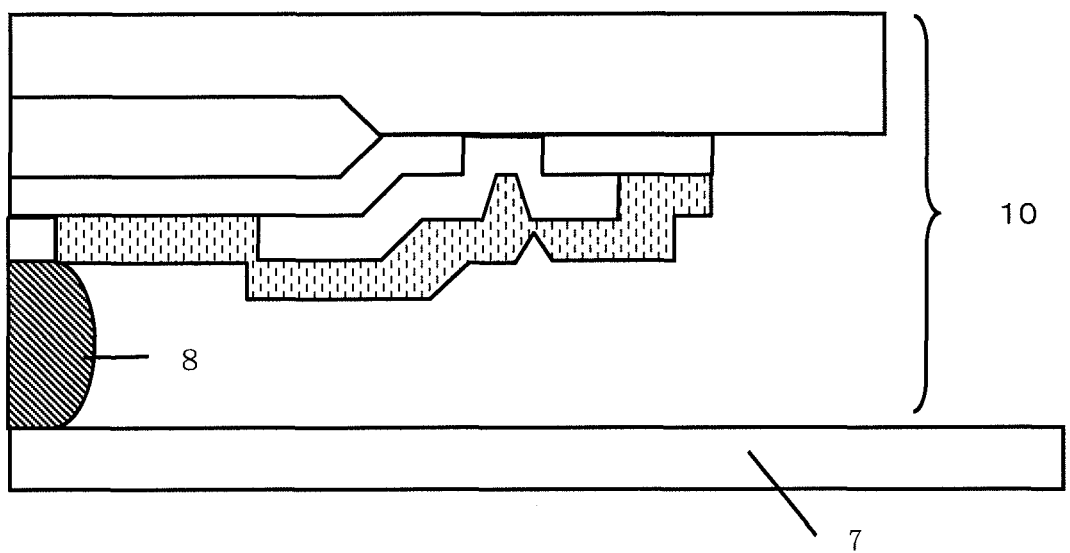
Figure 3C:
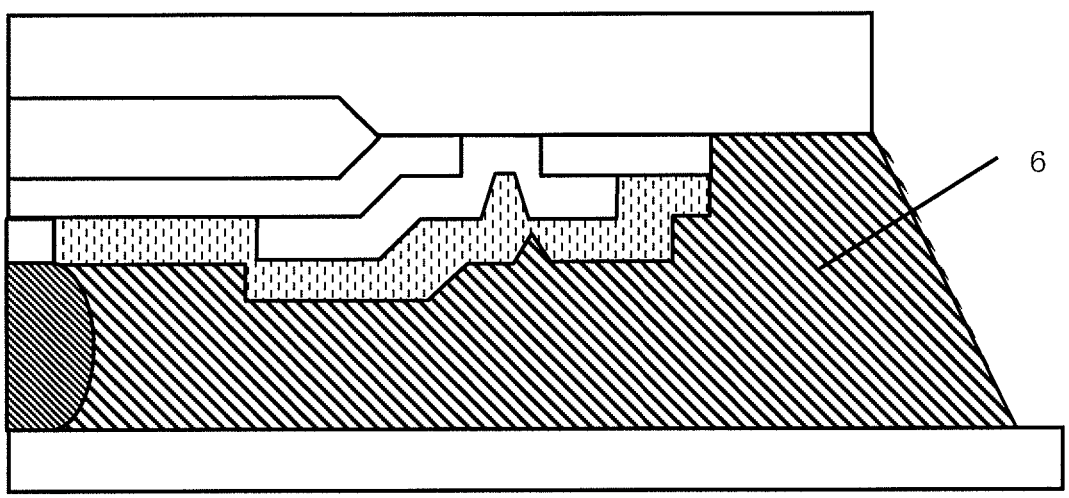

FIG. 3A to FIG. 3C are sectional views for illustrating manufacturing steps of the semiconductor device according to the embodiment of the present invention, which schematically illustrate steps for manufacturing the semiconductor device according to the embodiment illustrated in FIG. 1 in order of steps. First, as illustrated in FIG. 3A, the semiconductor chip 10 is manufactured using a semiconductor process suitable for a function thereof. A typical structure of the semiconductor chip 10 includes, similarly to that illustrated in FIG. 1, the silicon substrate 1, the field oxide film 2 formed on the surface of the silicon substrate 1, the interlayer insulating film 3 formed so as to extend from the field oxide film 2 to the surface of the silicon substrate 1, the metal wiring layer 4 formed on the interlayer insulating film 3, the protective film 5 formed on the metal wiring layer 4, and a solder bump 8 formed on a so-called pad portion that is an exposed portion of metal wiring having no protective film 5 formed thereon.

Various kinds of metal films stacked in steps of the semiconductor process for manufacturing such a structure are etched out on the scribe region. Only a portion of the insulating film 3 on the scribe region is etched out after a step of patterning the protective film 5 is completed. Alternatively, etching out may be carried out in steps of patterning various kinds of insulating films. The semiconductor chip 10 after the insulating film 3 on the scribe region is removed in this way is turned upside down and is mounted on the circuit board 7.

When, for example, as illustrated in FIG. 3B, the solder bump 8 is formed on the semiconductor chip 10 and is suitable for flip chip mounting, the solder bump 8 is connected to a track of the circuit board 7. For the purpose of melting solder for adhesion, heat treatment for a short time is carried out, and the solder bump 8 on the semiconductor chip 10 is pressed against the track on the circuit board 7.

After that, as illustrated in FIG. 3C, for the purpose of improving environmental resistance and moisture resistance, the encapsulant 6 is injected between the semiconductor chip 10 and the circuit board 7, and curing treatment thereof is appropriately applied. In a step of filling the encapsulant 6, when an amount and an injection direction of the encapsulant 6 are efficient, the encapsulant 6 does not cover a side surface of the chip 10 in the formed structure as illustrated in FIG. 3C. Specifically, the encapsulant 6 is only in contact with a front surface of the semiconductor chip 10, and is not in contact with the side surface of the semiconductor chip 10.

Figure 4:
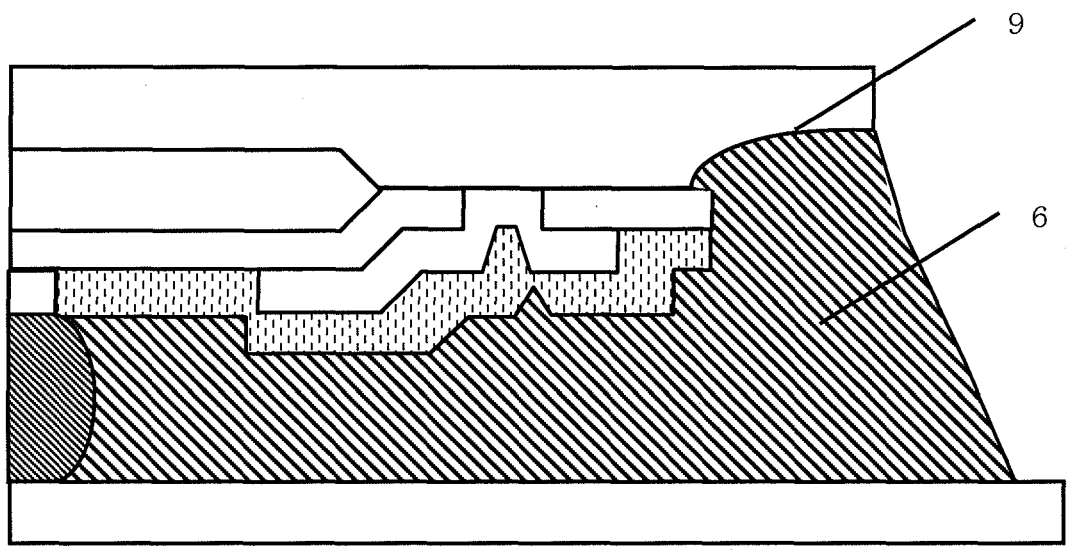
FIG. 4 is a sectional view for illustrating a semiconductor device according to another embodiment of the present invention.

FIG. 4 is a sectional view for illustrating a semiconductor device according to another embodiment of the present invention. When various kinds of insulating films are etched out in steps of patterning the insulating films, by removing a last insulating film using isotropic etching with carbon fluoride, the silicon substrate 1 in the scribe region is isotropically etched as illustrated in FIG. 4. The silicon substrate 1 becomes thinner from the inside toward a periphery thereof. In such a shape, similarly to the case of the embodiment described above, the interlayer insulating film 3 does not exist on the scribe region, and the encapsulant 6 is indirect contact with the semiconductor chip 10, and thus, a crack does not develop in the semiconductor chip 10. Further, the silicon substrate 1 has a depression 9 formed by the etching. The encapsulant 6 is filled in the depression 9, and, as a result, the depression 9 is in a shape of gripping the encapsulant 6, and thus, adherence between the silicon substrate 1 and the encapsulant 6 can be enhanced.

What is claimed is:

1. A flip-chip mounted semiconductor device, comprising:
   a circuit board;
   a semiconductor chip comprising a silicon substrate, the semiconductor chip being connected to the circuit board with an element surface of the semiconductor chip confronting the circuit board; and
   an encapsulant filling a space between the semiconductor chip and the circuit board, the encapsulant not covering a side surface of the semiconductor chip, and the side surface being exposed, wherein an outer peripheral portion of the semiconductor chip comprises a scribe region that extends to a perimeter of the silicon substrate, and the encapsulant is in direct contact with the silicon substrate of the semiconductor chip at the scribe region.

2. A The flip-chip mounted semiconductor device according to claim 1, wherein silicon of the silicon substrate is exposed from a region of the scribe region of the semiconductor chip, and the encapsulant and the silicon substrate are in direct contact with each other at the region.

3. The flip-chip mounted semiconductor device according to claim 2, wherein the silicon is exposed in a depressed region and the encapsulant fills the depressed region.

* * * * *